(12) United States Patent
Mitsuyasu

(10) Patent No.: US 9,082,508 B2
(45) Date of Patent: Jul. 14, 2015

(54) SEMICONDUCTOR DEVICE

(71) Applicant: Kabushiki Kaisha Toshiba, Minato-ku, Tokyo (JP)

(72) Inventor: Masahiro Mitsuyasu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/203,296

(22) Filed: Mar. 10, 2014

(65) Prior Publication Data
US 2015/0063006 A1 Mar. 5, 2015

(30) Foreign Application Priority Data

Aug. 30, 2013 (JP) .................................. 2013-180195

(51) Int. Cl.
*G11C 5/02* (2006.01)
*G11C 5/06* (2006.01)
*G11C 11/417* (2006.01)

(52) U.S. Cl.
CPC .............. *G11C 11/417* (2013.01); *G11C 5/025* (2013.01); *G11C 5/02* (2013.01)

(58) Field of Classification Search
CPC ................................... G11C 5/02; G11C 5/025
USPC ......................................... 365/51, 63, 189.08
See application file for complete search history.

(56) References Cited

U.S. PATENT DOCUMENTS

| 5,321,280 | A | | 6/1994 | Sakai |
| 5,477,067 | A | * | 12/1995 | Isomura et al. ................ 257/211 |
| 5,898,636 | A | * | 4/1999 | Isomura et al. .......... 365/230.03 |
| 6,980,463 | B2 | * | 12/2005 | Hosotani et al. .............. 365/158 |
| 8,533,641 | B2 | | 9/2013 | Park et al. |
| 8,647,938 | B1 | * | 2/2014 | Baars et al. .................... 438/197 |
| 2003/0190805 | A1 | * | 10/2003 | Inoue ............................ 438/689 |
| 2005/0081168 | A1 | * | 4/2005 | Chen et al. ......................... 716/4 |
| 2012/0183890 | A1 | * | 7/2012 | Shih ................................. 430/5 |
| 2013/0087834 | A1 | | 4/2013 | Park et al. |
| 2014/0009992 | A1 | * | 1/2014 | Poulton ........................... 365/63 |

FOREIGN PATENT DOCUMENTS

| JP | H05-013732 | 1/1993 |
| JP | H08-087899 | 4/1996 |
| JP | H09-283729 | 10/1997 |
| JP | H11-017014 | 1/1999 |
| JP | H11-186498 | 7/1999 |
| JP | H11-238850 | 8/1999 |
| JP | 2006-108397 | 4/2006 |

* cited by examiner

*Primary Examiner* — Ly D Pham
(74) *Attorney, Agent, or Firm* — Knobbe, Martens, Olson & Bear, LLP

(57) ABSTRACT

In one embodiment, a semiconductor device includes a substrate, and one or more logic circuit regions disposed on the substrate, and including a plurality of logic circuit elements. The device further includes a memory region disposed on the substrate, including a plurality of memory cells, and having a shape to surround each of the one or more logic circuit regions.

16 Claims, 5 Drawing Sheets

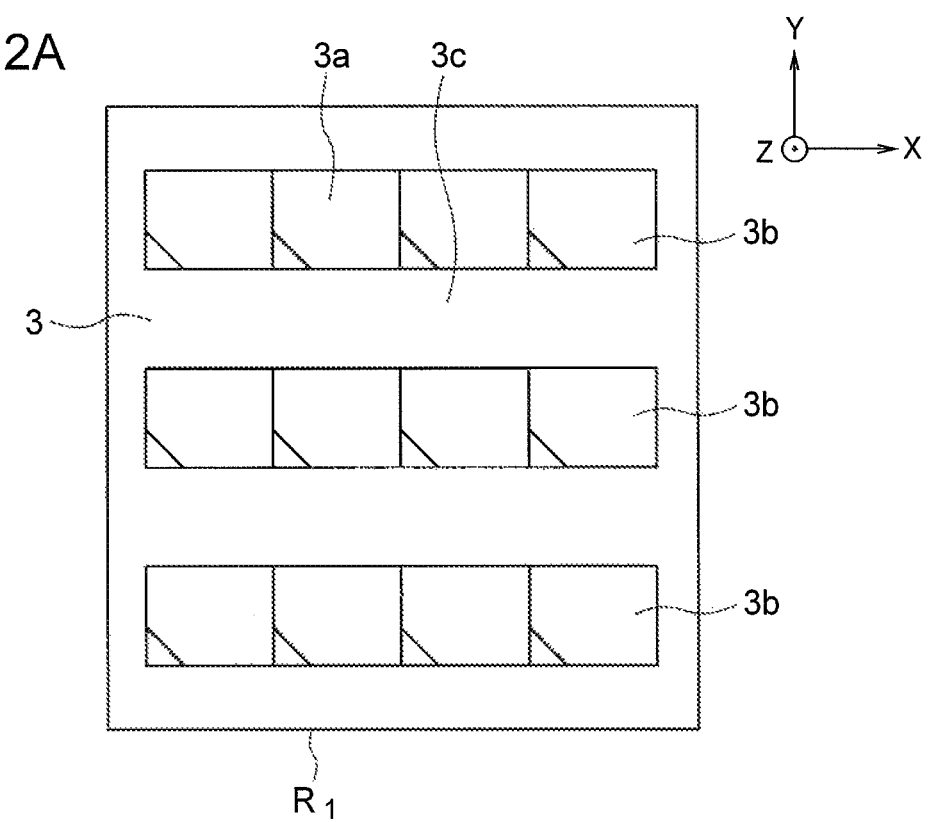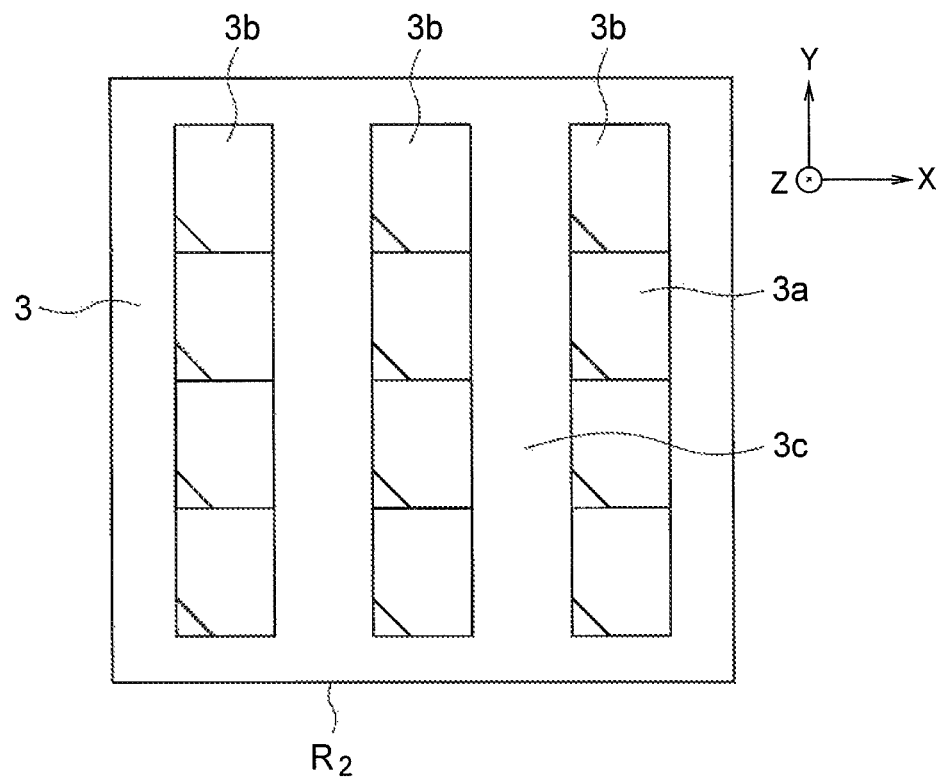

SEMICONDUCTOR DEVICE

CROSS REFERENCE TO RELATED APPLICATION

This application is based upon and claims the benefit of priority from the prior Japanese Patent Application No. 2013-180195, filed on Aug. 30, 2013, the entire contents of which are incorporated herein by reference.

FIELD

Embodiments described herein relate to a semiconductor device.

BACKGROUND

In recent years, a structured array device has drawn attention, which enables a purchaser to customize an interconnect layer of the device to realize a system on chip (SoC) device. A base array structure of the structured array device is typically formed by diverting a base array structure of a field-programmable gate array (FPGA). However, the structured array device in this case has problems that a degree of integration of the device is low and timing convergence of the device is deteriorated, which results in enlargement of the chip size of the device and degradation of the performance of the device.

BRIEF DESCRIPTION OF THE DRAWINGS

FIGS. 2A and 2B are plan views schematically illustrating an example of a structure of an SRAM region of the first embodiment;

DETAILED DESCRIPTION

Embodiments will now be explained with reference to the accompanying drawings.

In one embodiment, a semiconductor device includes a substrate, and one or more logic circuit regions disposed on the substrate, and including a plurality of logic circuit elements. The device further includes a memory region disposed on the substrate, including a plurality of memory cells, and having a shape to surround each of the one or more logic circuit regions.

First Embodiment

Figure 1A:
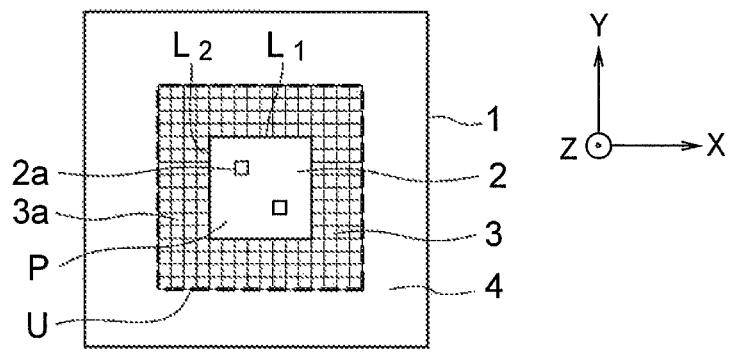
FIGS. 1A to 1C are plan views schematically illustrating examples of a structure of a semiconductor device of a first embodiment.
Figure 1B:
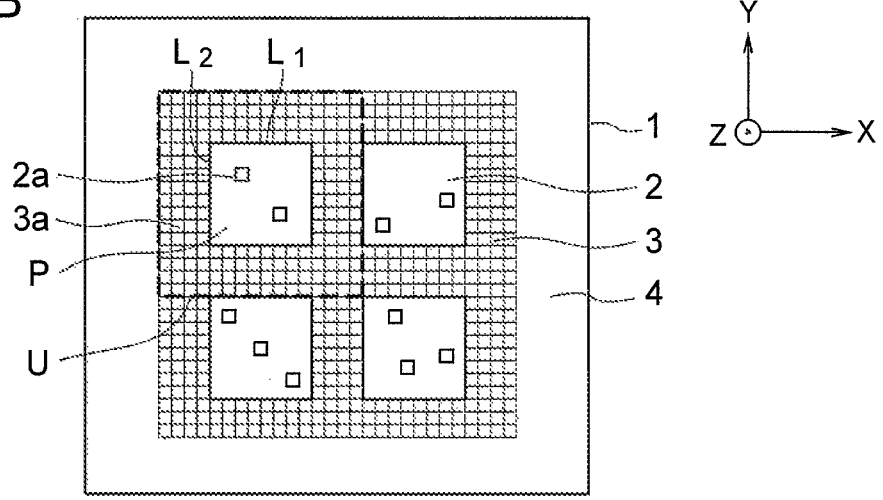
Figure 1C:
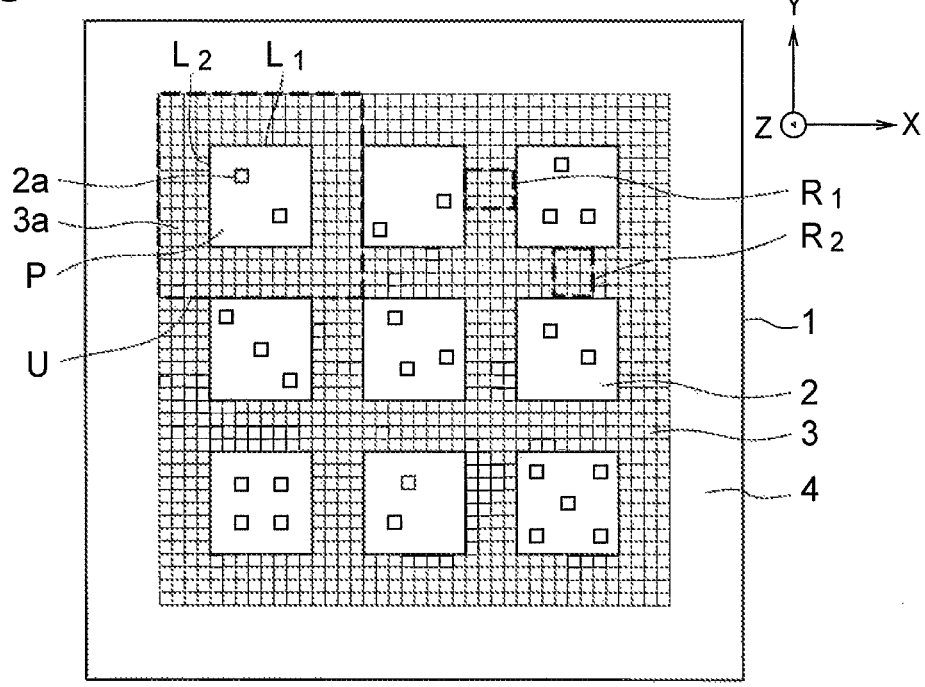

FIGS. 1A to 1C are plan views schematically illustrating examples of a structure of a semiconductor device of a first embodiment. The semiconductor device of the present embodiment is a structured array device. FIGS. 1A to 1C respectively illustrate first to third examples of the structure of the semiconductor device of the present embodiment.

The semiconductor device of FIG. 1A includes a substrate 1, one logic circuit region 2 provided on the substrate 1, one SRAM region 3 provided on the substrate 1 and having a shape to surround the logic circuit region 2, and one input/output region 4 provided on the substrate 1 and having a shape to surround the SRAM region 3.

The semiconductor device of FIG. 1B includes a substrate 1, four logic circuit regions 2 provided on the substrate 1, one SRAM region 3 provided on the substrate 1 and having a shape to individually surround the four logic circuit regions 2, and one input/output region 4 provided on the substrate 1 and having a shape to surround the SRAM region 3.

The semiconductor device of FIG. 1C includes a substrate 1, nine logic circuit regions 2 provided on the substrate 1, one SRAM region 3 provided on the substrate 1 and having a shape to individually surround the nine logic circuit regions 2, and one input/output region 4 provided on the substrate 1 and having a shape to surround the SRAM region 3.

The number of logic circuit regions 2 included in the semiconductor device of the present embodiment is not limited to one, four, or nine, and may be any number greater than one.

Hereinafter, the structure of the semiconductor device of the present embodiment will be described with reference to FIG. 1C. In addition, FIGS. 1A and 1B will be appropriately referred in the description.

The substrate 1 is, for example, a semiconductor substrate. FIG. 1C illustrates X and Y directions perpendicular to each other and parallel to a main surface of the substrate 1, and a Z direction perpendicular to the main surface of the substrate 1. The X and Y directions are examples of first and second directions. In the present specification, +Z direction is treated as an upward direction, and −Z direction is treated as a downward direction. For example, a structure lies in the +Z direction of the substrate 1 is expressed as being positioned above the substrate 1.

The logic circuit regions 2 include a plurality of logic circuit elements $2a$ such as transistors for logic gates. Each logic circuit region 2 of FIG. 1C has a shape having a plurality of first sides $L_1$ extending in the X direction and a plurality of second sides $L_2$ extending in the Y direction. Specifically, each logic circuit region 2 of FIG. 1C has a square or rectangular shape having two first sides $L_1$ and two second sides $L_2$. Each of these sides $L_1$ and $L_2$ faces the SRAM region 3. In FIG. 1C, the plurality of logic circuit regions 2 having the same size are arranged in a quadrangle-lattice manner (square-lattice manner) along the X and Y directions.

The SRAM region 3 includes a plurality of SRAM cells $3a$. The SRAM region 3 and the SRAM cells $3a$ are examples of a memory region and memory cells, respectively. The SRAM region 3 of FIG. 1C has a shape having a plurality of hollow regions P for including the logic circuit regions 2. Each hollow region P includes one logic circuit region 2. The SRAM region 3 of FIG. 1C includes a portion which is sandwiched between the logic circuit regions 2, and a portion which is sandwiched between a logic circuit region 2 and the input/output region 4.

The input/output region 4 includes an input/output circuit. The input/output region 4 includes an element for inputting a signal from an outside, an element for outputting a signal to an outside, and the like. The input/output region 4 of FIG. 1C has an annular shape along a periphery of a chip of the device.

The reference sign U indicates a base unit that is a unit of a base array of the semiconductor device of the present embodiment. The base unit U of the present embodiment is formed by one logic circuit region 2 and one SRAM region 3 that surrounds the logic circuit region 2. The size of the base unit U is set so that one million-gate scale integrated circuit can be mounted on one base unit U.

The base array of the semiconductor device of FIG. 1A is formed by one base unit U. Meanwhile, the base array of the semiconductor device of FIG. 1B or 1C is formed by a combination of a plurality of base units U. In the present embodiment, whether the base array is formed by one base unit U or by the plurality of base units U can be determined according to a chip size of the semiconductor device.

The semiconductor device of the present embodiment is a structured array device, and includes several first interconnect layers formed on the substrate 1. The first interconnect layer includes, for example, an interconnect used to form a logic gate such as NAND, NOR, NOT or the like by combining the logic circuit elements 2a, and an interconnect for the SRAM. In the present embodiment, the purchaser can customize second interconnect layers on the first interconnect layers to realize an SoC device.

FIGS. 2A and 2B are plan views schematically illustrating an example of a structure of the SRAM region 3 of the first embodiment.

FIG. 2A is an enlarged plan view of a region $R_1$ illustrated in FIG. 1C. The region $R_1$ is a portion of the SRAM region 3. Specifically, the region $R_1$ is a portion which is adjacent to a second side $L_2$ of a logic circuit region 2. The region $R_1$ includes a plurality of SRAM cell lines 3b extending in the X direction. Each of these SRAM cell lines 3b includes a plurality of SRAM cells 3a in line along the X direction. The SRAM cell lines 3b are an example of memory cell lines.

Meanwhile, FIG. 2B is an enlarged plan view of a region $R_2$ illustrated in FIG. 1C. The region $R_2$ is another portion of the SRAM region 3. Specifically, the region $R_2$ is a portion which is adjacent to a first side $L_1$ of a logic circuit region 2. The region $R_2$ includes a plurality of SRAM cell lines 3b extending in the Y direction. Each of these SRAM cell lines 3b includes a plurality of SRAM cells 3a in line along the Y direction.

The regions $R_1$ and $R_2$ further include a plurality of inter cell line regions 3c provided between the SRAM cell lines 3b. In the present embodiment, the logic circuit elements 2a can be arranged not only in the logic circuit regions 2 but also in the inter cell line regions 3c. The logic circuit elements 2a in the inter cell line regions 3c are used for connecting the logic circuit regions 2.

According to the present embodiment, the SRAM cell lines 3b in the region $R_1$ extend in the X direction, so that both of two logic circuit regions 2 adjacent to the region $R_1$ can more easily use the SRAM cell lines 3b in the region $R_1$. Furthermore, according to the present embodiment, the SRAM cell lines 3b in the region $R_1$ extend in the X direction, so that the two logic circuit regions 2 adjacent to the region $R_1$ can be easily connected by the logic circuit elements 2a in the inter cell line regions 3c. The same applies to the fact that the SRAM cell lines 3b in the region $R_2$ extend in the Y direction.

(1) Comparison Between First Embodiment and Conventional Example

Figure 3A:
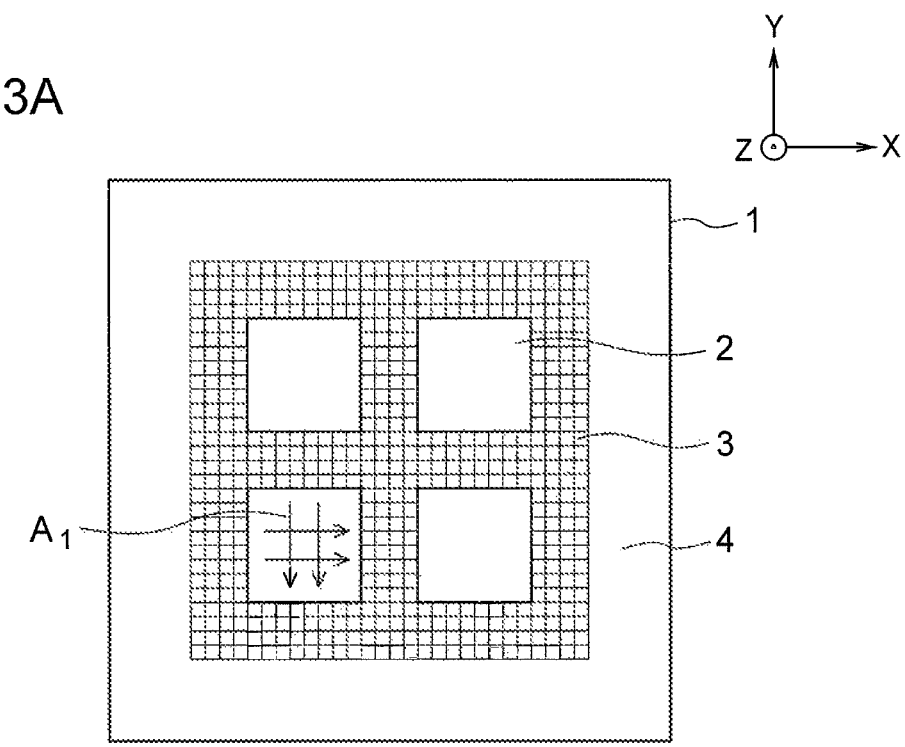
FIGS. 3A and 3B are plan views schematically illustrating structures of semiconductor devices of the first embodiment and a conventional example.
Figure 3B:
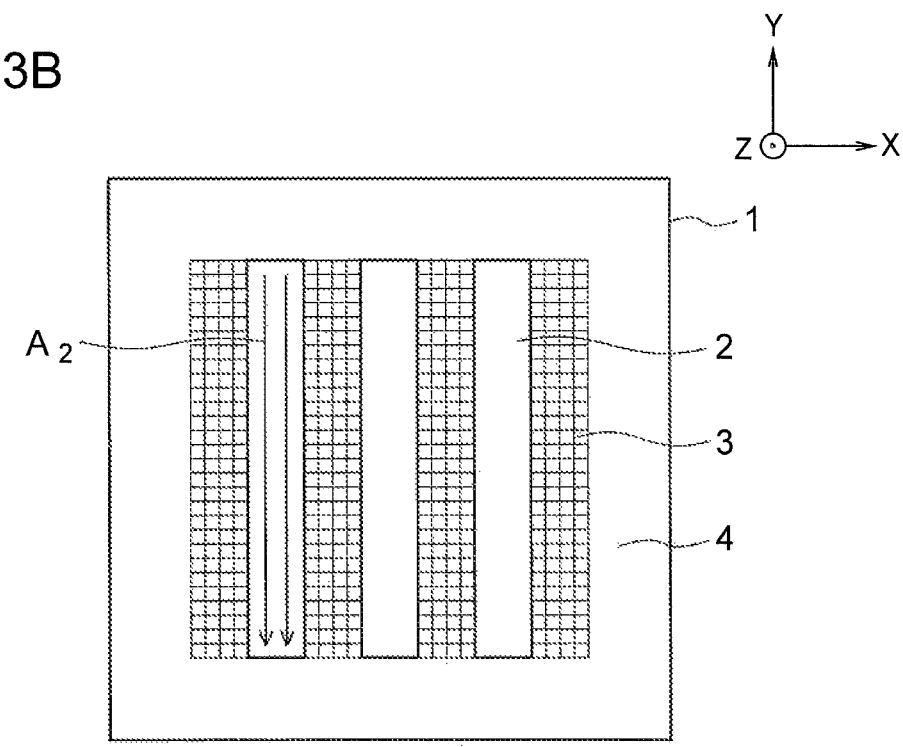

FIGS. 3A and 3B are plan views schematically illustrating structures of semiconductor devices of the first embodiment and a conventional example. FIG. 3A illustrates the semiconductor device of the first embodiment, and FIG. 3B illustrates the semiconductor device of the conventional example.

Similarly to the examples of FIGS. 1A to 1C, the semiconductor device of FIG. 3A includes one or more logic circuit regions 2 having a square or rectangular shape, and one SRAM region 3 having a shape to surround the logic circuit regions 2.

Meanwhile, the semiconductor device of FIG. 3B includes a plurality of logic circuit regions 2 having a belt-like shape extending in the Y direction, and a plurality of SRAM regions 3 having a belt-like shape extending in the Y direction. The logic circuit regions 2 and the SRAM regions 3 are alternately arranged along the X direction.

The arrows $A_1$ and $A_2$ indicate directions in which efficiency of arranging the interconnects is favorable when the interconnects are arranged in the logic circuit regions 2.

The logic circuit regions 2 of FIG. 3B have the belt-like shapes extending in the Y direction. Therefore, an interconnect extending in the Y direction can be easily arranged in the logic circuit regions 2, but an interconnect extending in the X direction cannot be easily arranged in the logic circuit regions 2. In addition, since the width of the logic circuit regions 2 of FIG. 3B in the X direction is narrow, the number of interconnects extending in the Y direction is limited in the logic circuit regions 2 of FIG. 3B. Therefore, if the number of the logic circuit elements 2a in the logic circuit regions 2 is increased, it becomes difficult to arrange a sufficient number of interconnects. Therefore, when the number of the logic circuit elements 2a is increased, the area or the number of the logic circuit regions 2 is increased. As a result, the degree of integration of the semiconductor device in FIG. 3B becomes low and therefore the chip size of the device is increased.

Meanwhile, the logic circuit regions 2 of FIG. 3A has smaller width difference in the X and Y directions than that of the logic circuit regions 2 of FIG. 3B. Therefore, an interconnect extending in the X direction and an interconnect extending in the Y direction can be easily arranged in the logic circuit regions 2 of FIG. 3A. Therefore, when the number of the logic circuit elements 2a is increased, an increase in the area or the number of the logic circuit regions 2 can be suppressed and a sufficient number of interconnects can be easily arranged in the logic circuit regions 2 of FIG. 3A. Therefore, according to the present embodiment, the degree of integration of the semiconductor device is improved and enlargement of the chip size of the semiconductor device can be suppressed.

Furthermore, the logic circuit regions 2 of FIG. 3B have the shapes longer in the Y direction. Therefore, the distance between the mutually connected logic circuit elements 2a and the distance between an SRAM cell 3a and a logic circuit element 2a that uses this SRAM cell 3a may be increased. Therefore, the lengths of the interconnects of the semiconductor device of FIG. 3B tend to be increased. As a result, the timing convergence of the semiconductor device in FIG. 3B is deteriorated due to an interconnect delay, and the performance of the semiconductor device is degraded.

Meanwhile, the logic circuit regions 2 of FIG. 3A have the shapes in which the width difference in the X and Y directions is small. Therefore, the mutually connected logic circuit elements 2a, and a SRAM cell 3a and a logic circuit element 2a that uses this SRAM cell 3a are often arranged closer. Therefore, the lengths of the interconnects of the semiconductor device of FIG. 3A tends to be shorter than the case of FIG. 3B. Therefore, according to the present embodiment, the timing convergence of the semiconductor device of FIG. 3A is improved by suppressing the interconnect delay, whereby the performance of the semiconductor device can be enhanced.

(2) Modification of First Embodiment

Figure 4:
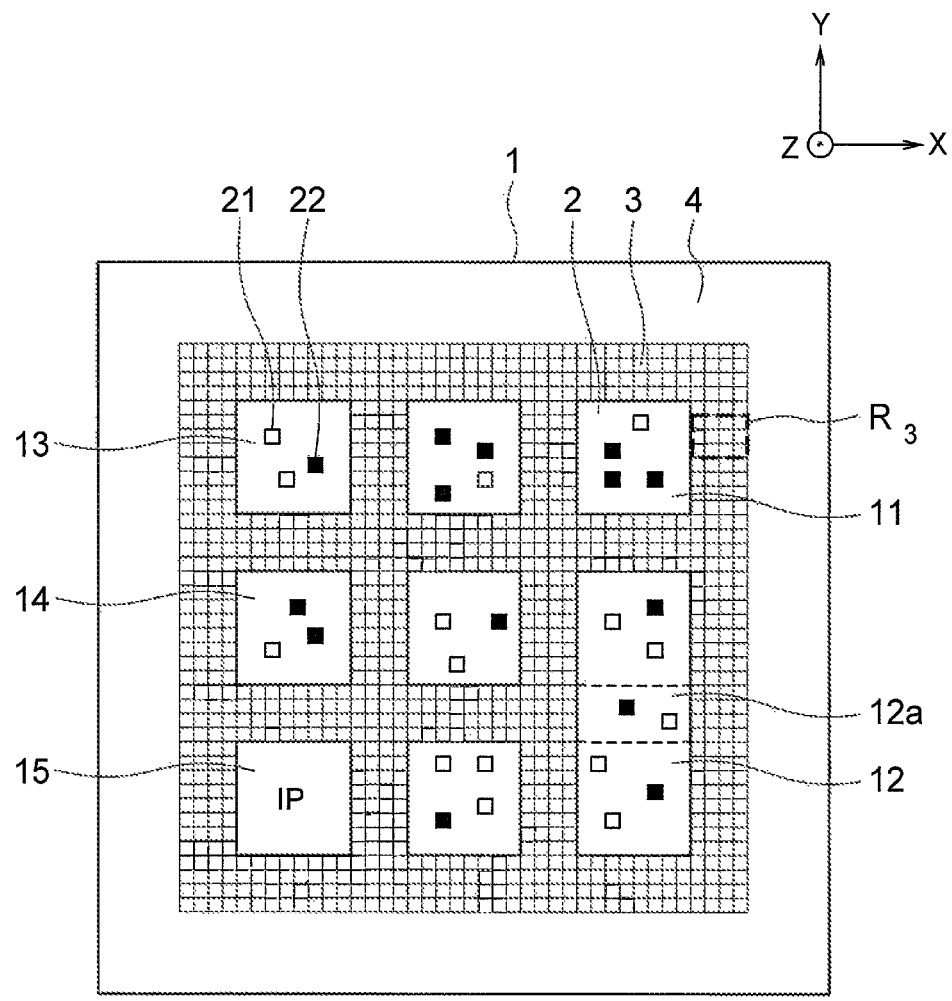
FIG. 4 is a plan view schematically illustrating a structure of a semiconductor device of a modification of the first embodiment.

FIG. 4 is a plan view schematically illustrating a structure of a semiconductor device of a modification of the first embodiment.

The semiconductor device of FIG. 4 includes, as the logic circuit regions 2, one or more first area regions 11 having a first area, and one or more second area regions 12 having a second area larger than the first area.

The first area regions 11 have the same size as a logic circuit region 2 forming a base unit U. Meanwhile, the second area regions 12 are formed by merging a plurality of first area regions 11.

The second area region 12 illustrated in FIG. 4 is formed by merging two first area regions 11. The reference sign 12a indicates a region where the SRAM region 3 was supposed to be arranged. The second area of the second area region 12 of FIG. 4 is set to a total value of two first areas of two first area regions 11 and the area of the region 12a. Therefore, the second area of the second area region 12 of FIG. 4 is larger than twice the first area.

The second area region 12 may be formed by merging three or more first area regions 11. When N first area regions 11 are merged (N is an integer of 3 or more), the second area is larger than N times the first area. In this case, the second area region 12 may have a square or rectangular shape, or may have a shape other than the square or rectangular shape (for example, L shape). For example, the second area region 12 is prepared when use of a logic circuit region 2 larger than the first area region 11 is required.

Furthermore, the semiconductor device of FIG. 4 includes, as the logic circuit regions 2, one or more first transistor regions 13 and one or more second transistor regions 14.

Each first transistor region 13 includes, as the logic circuit elements 2a, one or more LVT transistors 21 and one or more SVT transistors 22. In each first transistor region 13, the number of the SVT transistors 22 is smaller than the number of the LVT transistors 21. The LVT transistors 21 are an example of first transistors having a first threshold voltage, and the SVT transistors 22 are an example of second transistors having a second threshold voltage that is higher than the first threshold voltage.

Each second transistor region 14 includes, as the logic circuit elements 2a, one or more LVT transistor 21 and one or more SVT transistor 22. In each second transistor region 14, the number of the SVT transistors 22 is larger than the number of the LVT transistors 21.

In this manner, the first transistor regions 13 are regions mainly including the LVT transistors 21. The first transistor regions 13 can be used as logic circuit regions 2 for high-speed processing, for example.

Meanwhile, the second transistor regions 14 are regions mainly including the SVT transistors 22. The second transistor regions 14 can be used as logic circuit regions 2 for low-power processing, for example.

Each of the first and second transistor regions 13 and 14 may include one or more HVT transistors together with the LVT and SVT transistors 21 and 22, or in place of any of the LVT and SVT transistors 21 and 22. The HVT transistors have a threshold voltage higher than that of the LVT transistors 21 and that of the SVT transistors 22.

When the first and second transistor regions 13 and 14 include the LVT, SVT and HVT transistors, any two of the LVT, SVT and HVT transistors are an example of the first transistors having the first threshold voltage and the second transistors having the second threshold voltage that is higher than the first threshold voltage. In addition, the remaining one of the LVT, SVT and HVT transistors is an example of third transistors having a third threshold voltage that is different from the first and second threshold voltages.

Furthermore, the semiconductor device of FIG. 4 includes, as a logic circuit region 2, an intellectual property (IP) core region 15. In the present embodiment, a circuit block often used in a logic circuit is prepared in the IP core region 15 as an IP core in advance. Therefore, according to the present embodiment, the purchaser of the structured array device can easily perform circuit design. The IP core region 15 and the IP core are examples of an IP circuit region and an IP circuit, respectively. The semiconductor device of FIG. 4 may include a plurality of IP core regions 15 as the logic circuit region 2.

Figure 5:
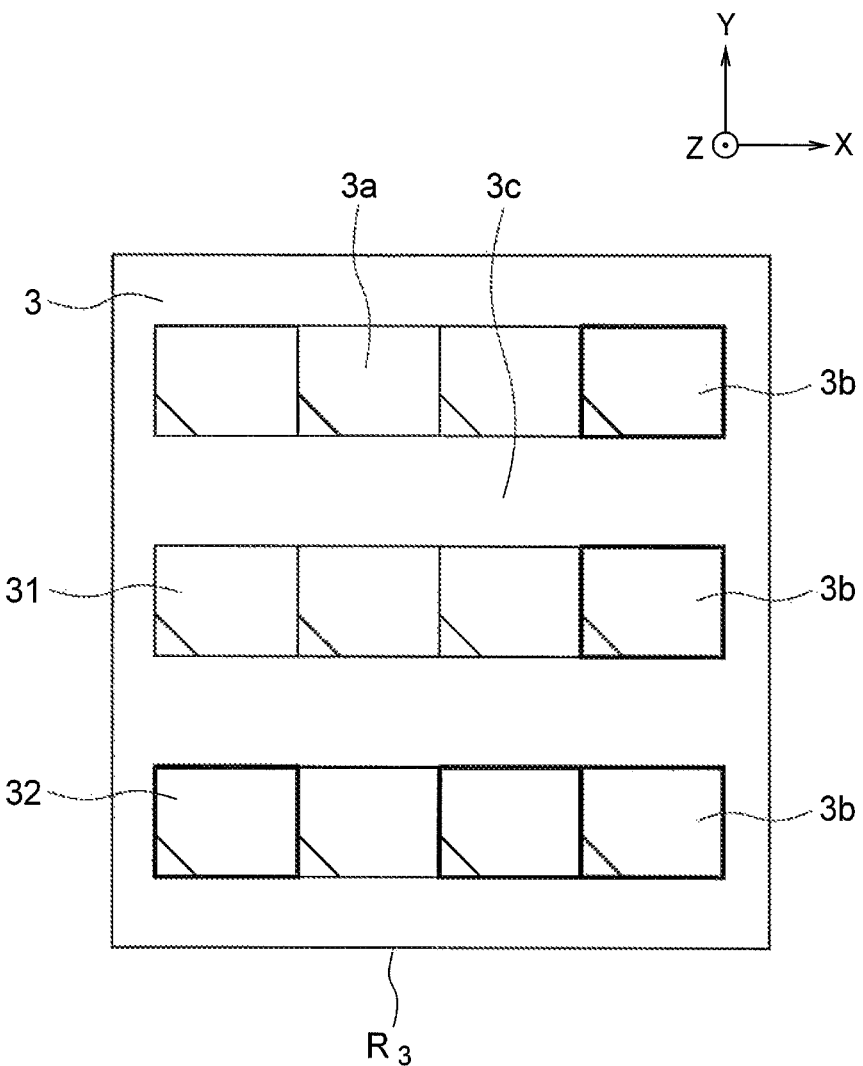
FIG. 5 is a plan view schematically illustrating a structure of an SRAM region of the modification of the first embodiment.

FIG. 5 is a plan view schematically illustrating a structure of the SRAM region 3 of the modification of the first embodiment.

FIG. 5 is an enlarged plan view of a region $R_3$ illustrated in FIG. 4. The region $R_3$ is a portion of the SRAM region 3. Specifically, the region $R_3$ is a portion which is adjacent to a second side $L_2$ of a logic circuit region 2.

The region $R_3$ includes, as the SRAM cells 3a, first SRAM cells 31 to be used and second SRAM cells 32 not to be used. The first SRAM cells 31 are used as normal memory cells, but the second SRAM cells 32 are not used as normal memory cells.

In the present embodiment, the second SRAM cells 32 are used as redundant cells that are replaced with the first SRAM cells 31 having failure. Therefore, the semiconductor device in the present embodiment includes storage locations for storing positions of the first SRAM cells 31 having failure and positions of the second SRAM cells 32 which are used as redundant cells.

According to the present embodiment, the second SRAM cells 32 are used as redundant cells, so that the yield of the semiconductor device can be improved.

As described above, the semiconductor device of the present embodiment includes the one or more logic circuit regions 2, and the SRAM region 3 having the shape to surround the logic circuit regions 2.

Therefore, according to the present embodiment, efficiency of arranging the interconnects in the logic circuit elements 2a can be improved, so that the degree of integration of the semiconductor device can be improved.

In addition, according to the present embodiment, the interconnects for the logic circuit elements 2a and of the SRAM cells 3a can be shortened, so that the timing convergence of the semiconductor device can be improved.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a substrate;
    one or more logic circuit regions disposed on the substrate, and including a plurality of logic circuit elements; and
    a memory region disposed on the substrate, including a plurality of memory cells, and having a shape to surround each of the one or more logic circuit regions.

2. The device of claim 1, further comprising a plurality of logic circuit regions as the one or more logic circuit regions, wherein
    a first area region among the plurality of logic circuit regions has a first area, and
    a second area region among the plurality of logic circuit regions has a second area larger than twice the first area.

3. The device of claim 2, wherein the plurality of logic circuit regions includes, as the first area region, a logic circuit region having a square or rectangular shape.

4. The device of claim 2, wherein the plurality of logic circuit regions includes, as the second area region, a logic circuit region having a shape other than a square or rectangular shape.

5. The device of claim 1, further comprising a plurality of logic circuit regions as the one or more logic circuit regions, wherein
   a first transistor region among the plurality of logic circuit regions includes, as the logic circuit elements, one or more first transistors having a first threshold voltage, and one more second transistors having a second threshold voltage higher than the first threshold voltage, a number of the second transistors in the first transistor region being smaller than a number of the first transistors in the first transistor region, and
   a second transistor region among the plurality of logic circuit regions includes, as the logic circuit elements, one or more first transistors having the first threshold voltage, and one or more second transistors having the second threshold voltage, a number of the second transistors in the second transistor region being larger than a number of the first transistors in the second transistor region.

6. The device of claim 5, wherein at least one of the first and second transistor regions further includes, as the logic circuit elements, one or more third transistors having a third threshold voltage different from the first and second threshold voltages.

7. The device of claim 1, wherein each of the logic circuit regions has a shape having a plurality of first sides extending in a first direction, and a plurality of second sides extending in a second direction perpendicular to the first direction.

8. The device of claim 7, wherein each of the first and second sides faces the memory region.

9. The device of claim 7, wherein the logic circuit regions are arranged in a quadrangle-lattice manner along the first and second directions.

10. The device of claim 7, wherein
    a portion of the memory region which is adjacent to a first side includes a plurality of memory cell lines extending in the second direction, and
    a portion of the memory region which is adjacent to a second side includes a plurality of memory cell lines extending in the first direction.

11. The device of claim 10, wherein the memory region includes a logic circuit element arranged between the memory cell lines extending in the first direction or between the memory cell lines extending in the second direction.

12. The device of claim 1, wherein the memory region has a plurality of hollow regions.

13. The device of claim 12, wherein the logic circuit regions are arranged so that each of the hollow regions includes one logic element circuit.

14. The device of claim 12, wherein the hollow regions are arranged in a quadrangle-lattice manner along a first direction and a second direction perpendicular to the first direction.

15. The device of claim 1, further comprising an input/output region having an annular shape to surround the memory region.

16. The device of claim 15, wherein the memory region includes a portion which is sandwiched between the logic circuit regions, and a portion which is sandwiched between a logic circuit region and the input/output region.

* * * * *